(12) United States Patent
Zhou et al.

(10) Patent No.: US 10,879,615 B2
(45) Date of Patent: Dec. 29, 2020

(54) ODU AND TRANSMIT POWER CONTROL METHOD FOR ODU

(71) Applicant: HUAWEI TECHNOLOGIES CO., LTD., Shenzhen (CN)

(72) Inventors: Yuxiang Zhou, Xi'an' (CN); Haiming Fan, Segrate (IT); Qing Zhao, Xi'an (CN); Guoxiang Cao, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 22 days.

(21) Appl. No.: 16/454,052

(22) Filed: Jun. 27, 2019

(65) Prior Publication Data

US 2019/0348764 A1 Nov. 14, 2019

Related U.S. Application Data

(63) Continuation of application No. PCT/CN2016/112349, filed on Dec. 27, 2016.

(51) Int. Cl.
*H01Q 13/06* (2006.01)
*H01P 3/127* (2006.01)
(Continued)

(52) U.S. Cl.
CPC .............. *H01Q 13/06* (2013.01); *H01P 3/127* (2013.01); *H04B 7/005* (2013.01); *H04W 52/52* (2013.01)

(58) Field of Classification Search
CPC ........ G01R 28/08; H04W 52/52; H01P 3/127; H04B 7/005; H04B 17/309; H01Q 13/06
See application file for complete search history.

(56) References Cited

U.S. PATENT DOCUMENTS

2003/0118060 A1\* 6/2003 Spuehler ............... H01S 3/1118
372/18
2003/0163820 A1 8/2003 Knutson et al.
(Continued)

FOREIGN PATENT DOCUMENTS

CN 101299624 A 11/2008
CN 101800716 A 8/2010
(Continued)

OTHER PUBLICATIONS

Cong Xu:"Design of Digital Microwave Communication System Outdoor Unit Microwave Module",2014,total 63 pages.

*Primary Examiner* — Graham P Smith
*Assistant Examiner* — Jae K Kim
(74) *Attorney, Agent, or Firm* — Kilpatrick Townsend & Stockton LLP

(57) ABSTRACT

Embodiments of this application disclose an ODU and a transmit power control method for an ODU. The ODU includes a controller, a radio frequency processor, a waveguide channel, an antenna, a wave-absorbing block, a detector, and a motor controller. The controller is configured to obtain target transmit power, first transmit power, and a to-be-transmitted first radio frequency signal, and generate a control signal based on a difference between the target transmit power and the first transmit power. The radio frequency processor is configured to: perform frequency conversion on the first radio frequency signal to obtain the second radio frequency signal, and transmit the second radio frequency signal, where the second radio frequency signal is transmitted to the antenna through the waveguide channel. The wave-absorbing block has one end located in the waveguide channel and the other end connected to the motor controller. The motor controller is configured to drive, according to the control signal, the wave-absorbing block to move, so that the first transmit power is consistent with the (Continued)

target transmit power. In this way, according to the embodiments of this application, transmit power can be accurately adjusted, and the ODU can transmit a radio frequency signal at relatively low transmit power.

10 Claims, 5 Drawing Sheets

(51) Int. Cl.
*H04B 7/005* (2006.01)
*H04W 52/52* (2009.01)

(56) References Cited

U.S. PATENT DOCUMENTS

| | | | |
|---|---|---|---|
| 2005/0017815 A1 | 1/2005 | Asao et al. | |
| 2006/0204170 A1* | 9/2006 | Igarashi | H04B 10/25077 385/24 |
| 2013/0099989 A1* | 4/2013 | Pantea | H01Q 19/08 343/783 |
| 2014/0287100 A1* | 9/2014 | Libman | H05B 6/6441 426/87 |
| 2016/0161535 A1* | 6/2016 | Kwon | G01R 29/0892 250/206 |

FOREIGN PATENT DOCUMENTS

| | | |
|---|---|---|
| CN | 102104432 A | 6/2011 |
| CN | 105206898 A | 12/2015 |
| CN | 105676003 A | 6/2016 |
| WO | 2013123522 A1 | 8/2013 |

\* cited by examiner

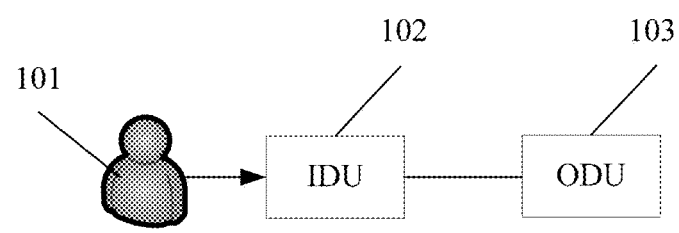
FIG. 1-a

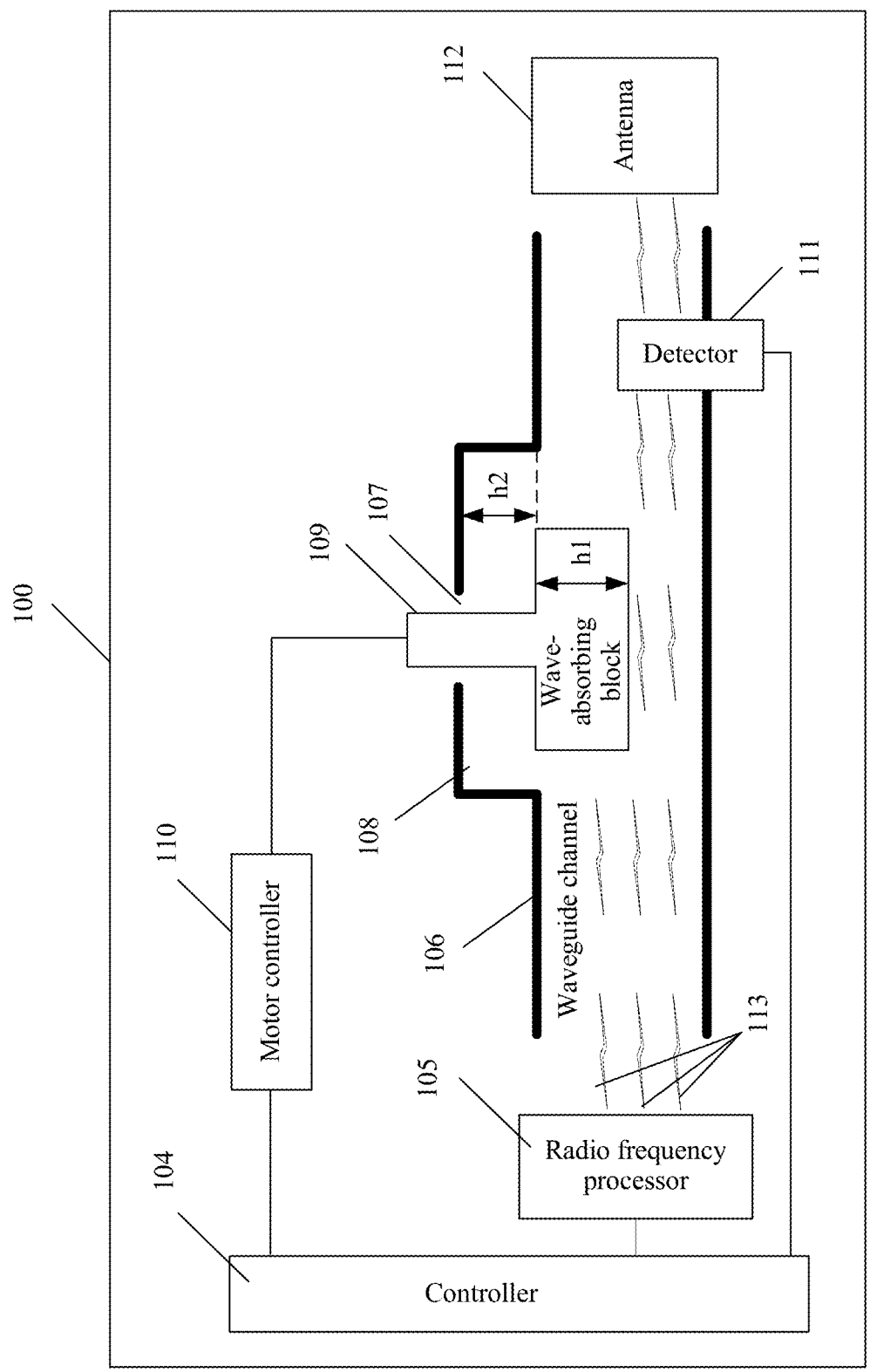
FIG. 1-b

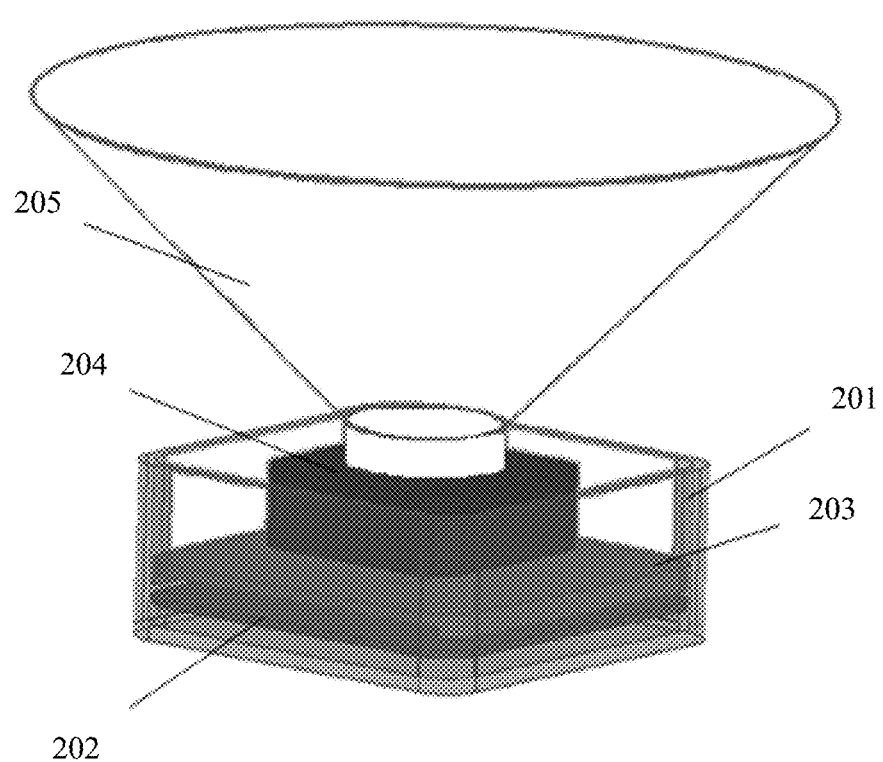
FIG. 2-a
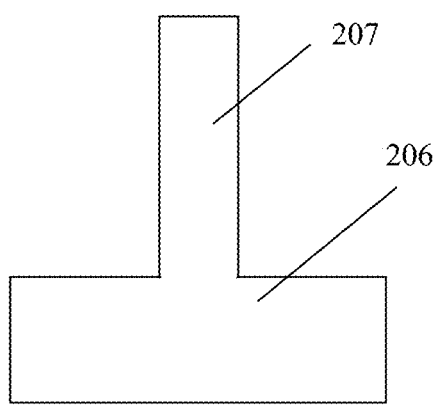
FIG. 2-b

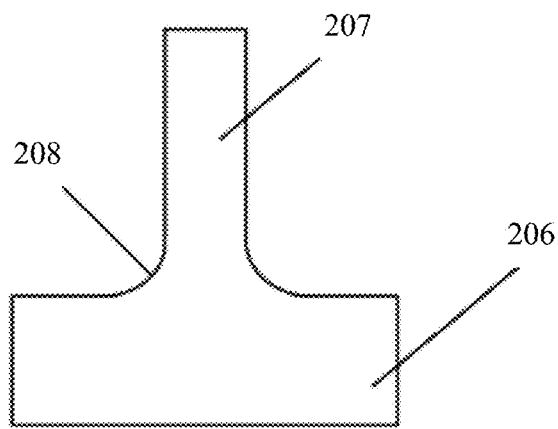
FIG. 2-c
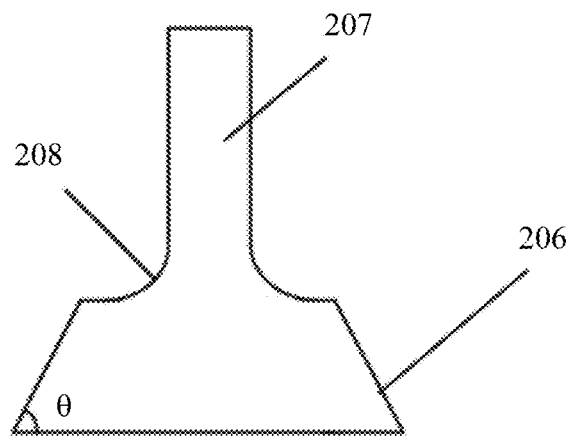
FIG. 2-d

ODU AND TRANSMIT POWER CONTROL METHOD FOR ODU

CROSS-REFERENCE TO RELATED APPLICATIONS

This application is a continuation of International Application No. PCT/CN2016/112349, filed on Dec. 27, 2016, the disclosure of which is hereby incorporated by reference in its entirety.

TECHNICAL FIELD

This application relates to the field of microwave communications technologies, and in particular, to an ODU and a transmit power control method for an ODU.

BACKGROUND

With popularity of microwave communication, microwave networks are more densely deployed, and a distance between microwave outdoor units (Outdoor Unit, ODU) is becoming smaller. In addition, an ODU needs to transmit a radio frequency signal at relatively low transmit power to reduce interference of the ODU to surrounding space, or in a scenario in which the ODU is used for near field communication.

The inventor of this application finds that, an existing method of reducing transmit power of an ODU is disposing an attenuator circuit in the ODU. Because a detector tube in the attenuator circuit cannot complete normal detection at low power (for example, −20 dB), the low power cannot be accurately achieved by using the attenuator circuit. In addition, the ODU is mounted outdoors, and there is a large temperature difference between operating environments. Because the attenuator circuit is greatly affected by temperature, stability is relatively poor. Consequently, the attenuator circuit cannot meet a requirement of the ODU for accurately transmitting a radio frequency signal at relatively low transmit power.

SUMMARY

Embodiments of this application provide an ODU and a transmit power control method for an ODU, to resolve the following prior art problem: Transmit power cannot be accurately adjusted and an ODU cannot transmit a radio frequency signal at relatively low transmit power.

A first aspect of the embodiments of this application provides an ODU, including: a controller, a radio frequency processor, a waveguide channel, an antenna, a wave-absorbing block, a detector, and a motor controller, where the controller is configured to: obtain target transmit power, first transmit power, and a to-be-transmitted first radio frequency signal, and generate a control signal based on a difference between the target transmit power and the first transmit power, where the first transmit power is real-time transmit power obtained by the detector by detecting a second radio frequency signal, transmitted to the antenna, in the waveguide channel;

the radio frequency processor is configured to: perform frequency conversion on the first radio frequency signal to obtain the second radio frequency signal, and transmit the second radio frequency signal, where the second radio frequency signal is transmitted to the antenna through the waveguide channel, and an opening is disposed on the waveguide channel;

the wave-absorbing block has one end located in the waveguide channel and the other end connected to the motor controller through the opening, and is configured to absorb the second radio frequency signal transmitted to a surface of the wave-absorbing block; and the motor controller is configured to drive, according to the control signal, the wave-absorbing block to move, so that the first transmit power is consistent with the target transmit power.

Optionally, the motor controller may drive the wave-absorbing block to move in a straight line, rotate, or move in a straight line and rotate at the same time, provided that a position of the wave-absorbing block is changed so that the real-time transmit power is consistent with the target transmit power.

According to the embodiments of this application, the controller can generate the control signal based on the difference between the real-time transmit power and the target transmit power, and the motor controller can drive, according to the control signal, the wave-absorbing block to move in the waveguide channel. Because the wave-absorbing block can absorb an electromagnetic wave transmitted to the surface of the wave-absorbing block, driving the wave-absorbing block to move in the waveguide channel by the motor controller allows the real-time transmit power to be consistent with the target transmit power. In other words, the ODU provided in this embodiment of this application can perform closed-loop control on transmit power. In this way, the transmit power can be accurately adjusted. In addition, the wave-absorbing block is passive, and a wave-absorbing feature of the wave-absorbing block is less affected by temperature. Therefore, in this embodiment of this application, the ODU can transmit a radio frequency signal at relatively low transmit power.

It should be noted that the wave-absorbing block is a structure made of a wave-absorbing material, or may be obtained by coating a layer of the wave-absorbing material on a surface of a solid block. During transmission of a radio frequency signal, when the wave-absorbing block is located in a transmission channel of the radio frequency signal, a part of the radio frequency signal is transmitted to the wave-absorbing material. An area of the wave-absorbing material for obtaining the incoming radio frequency signal is an effective wave-absorbing area. A size of the effective wave-absorbing area affects magnitude of output power. Specifically, a larger effective wave-absorbing area indicates a larger decrease in the output power, and a smaller effective wave-absorbing area indicates a smaller decrease in the output power. Therefore, the magnitude of the output power can be adjusted by changing the effective wave-absorbing area in the wave-absorbing block. Specifically, the effective wave-absorbing area in the wave-absorbing block may be changed by moving up or down or rotating the wave-absorbing block. It should be noted that the wave-absorbing material may be a material with a magnetic loss angle tangent parameter greater than zero, and has a function of absorbing and attenuating the radio frequency signal.

Optionally, in some possible implementations of this application, a convex cavity is disposed in the waveguide channel, and the opening is disposed on the cavity.

In this way, the wave-absorbing block can pass through the opening, and have one part located in the waveguide channel and one part connected to the motor controller. The convex cavity is disposed in the waveguide channel, so that the motor controller can drive the wave-absorbing block to move toward the cavity, thereby reducing impact of the wave-absorbing block on the transmit power.

Optionally, in some possible implementations of this application, the wave-absorbing block is in a "T"-shaped structure and includes a baseplate and a connecting rod connected to the baseplate. The baseplate is located in the waveguide channel. The connecting rod protrudes from the waveguide channel through the opening and is connected to the motor controller. A height of the baseplate is less than or equal to a height of the cavity. In this way, the motor controller can drive the wave-absorbing block to be located completely inside the cavity, thereby further reducing the impact of the wave-absorbing block on the transmit power.

Optionally, in some possible implementations of this application, a cross-section of the baseplate in a transmission direction of the second radio frequency signal is a trapezoid. Optionally, in some possible implementations of this application, a chamfer is disposed at an intersection between the baseplate of the wave-absorbing block and the connecting rod of the wave-absorbing block. Optionally, in some possible implementations of this application, a base angle of the trapezoid close to the radio frequency transmitter ranges from 30° to 60°.

In a simulation experiment, when it is detected that the cross-section of the baseplate of the wave-absorbing block in the transmission direction of the second radio frequency signal is set to a trapezoid, or a chamfer is disposed between the wave-absorbing block and the connecting rod, the motor controller can linearly control the wave-absorbing block to move. For example, in some possible embodiments, when the motor controller drives the wave-absorbing block to move up and down in the waveguide channel, 3 dB/mm can be achieved. To be specific, when the motor controller drives the wave-absorbing block to move down by 1 mm, the transmit power is reduced by 3 dB.

Optionally, in some possible implementations of this application, the ODU may further include a shielding case and a duplexer that are located between the radio frequency processor and the antenna. In this case, the waveguide channel may include a waveguide channel for transmitting the second radio frequency signal in the shielding case, and a waveguide channel for transmitting the second radio frequency signal in the duplexer.

A second aspect of the embodiments of this application provides a transmit power control method for an ODU, where the ODU includes a controller, a radio frequency processor, a waveguide channel, an antenna, a wave-absorbing block, a detector, and a motor controller, and the method includes:

obtaining, by the controller, target transmit power and a to-be-transmitted first radio frequency signal;

performing, by the radio frequency processor, frequency conversion on the first radio frequency signal to obtain a second radio frequency signal, and transmitting the second radio frequency signal, where the second radio frequency signal is transmitted to the antenna through the waveguide channel, and an opening is disposed on the waveguide channel;

obtaining, by the detector, first transmit power, where the first transmit power is real-time transmit power of the second radio frequency signal, transmitted to the antenna, in the waveguide channel;

generating, by the controller, a control signal based on a difference between the target transmit power and the first transmit power; and driving, by the motor controller according to the control signal, the wave-absorbing block to move, so that the first transmit power is consistent with the target transmit power, where the wave-absorbing block has one end located in the waveguide channel and the other end connected to the motor controller through the opening, and is configured to absorb the second radio frequency signal transmitted to a surface of the wave-absorbing block.

Optionally, in some possible implementations of this application, a convex cavity is disposed in the waveguide channel, and the opening is disposed on the cavity.

Optionally, in some possible implementations of this application, the wave-absorbing block is in a "T"-shaped structure and includes a baseplate and a connecting rod connected to the baseplate. The baseplate is located in the waveguide channel. The connecting rod protrudes from the waveguide channel through the opening and is connected to the motor controller. A height of the baseplate is less than or equal to a height of the cavity. In this way, the motor controller can drive the wave-absorbing block to be located completely inside the cavity, thereby further reducing impact of the wave-absorbing block on transmit power.

Optionally, a chamfer is disposed at an intersection between the baseplate of the wave-absorbing block and the connecting rod of the wave-absorbing block. In a simulation experiment, when it is detected that a cross-section of the baseplate of the wave-absorbing block in a transmission direction of the second radio frequency signal is set to a trapezoid, or a chamfer is disposed between the wave-absorbing block and the connecting rod, the motor controller can linearly control the wave-absorbing block to move. For example, when the motor controller drives the wave-absorbing block to move up and down in the waveguide channel, 3 dB/mm can be achieved. To be specific, when the motor controller drives the wave-absorbing block to move down by 1 mm, the transmit power is reduced by 3 dB.

Optionally, in some possible implementations of this application, the ODU further includes a shielding case and a duplexer that are located between the radio frequency processor and the antenna. The waveguide channel includes a waveguide channel for transmitting the second radio frequency signal in the shielding case, and a waveguide channel for transmitting the second radio frequency signal in the duplexer.

According to the embodiments of this application, the controller can generate the control signal based on the difference between the real-time transmit power and the target transmit power, and the motor controller can drive, according to the control signal, the wave-absorbing block to move in the waveguide channel. Because the wave-absorbing block can absorb an electromagnetic wave transmitted to the surface of the wave-absorbing block, driving the wave-absorbing block to move in the waveguide channel by the motor controller allows the real-time transmit power to be consistent with the target transmit power. In other words, the ODU provided in the embodiments of this application can perform closed-loop control on transmit power. In this way, the transmit power can be accurately adjusted. In addition, the wave-absorbing block is passive, and a wave-absorbing feature of the wave-absorbing block is less affected by temperature. Therefore, in the embodiments of this application, the ODU can transmit a radio frequency signal at relatively low transmit power.

BRIEF DESCRIPTION OF DRAWINGS

FIG. 1-*a* is a schematic diagram of an application scenario including an ODU according to an embodiment of this application;

FIG. 1-*b* is a schematic structural diagram of an ODU according to an embodiment of this application;

FIG. 2-*a* is a schematic structural diagram of an ODU according to an embodiment of this application;

FIG. 2-*b* is a schematic diagram of a cross-section of a wave-absorbing block according to an embodiment of this application;

FIG. 2-*c* is a schematic diagram of a cross-section of another wave-absorbing block according to an embodiment of this application;

FIG. 2-*d* is a schematic diagram of a cross-section of another wave-absorbing block according to an embodiment of this application.

DESCRIPTION OF EMBODIMENTS

Figure 3:
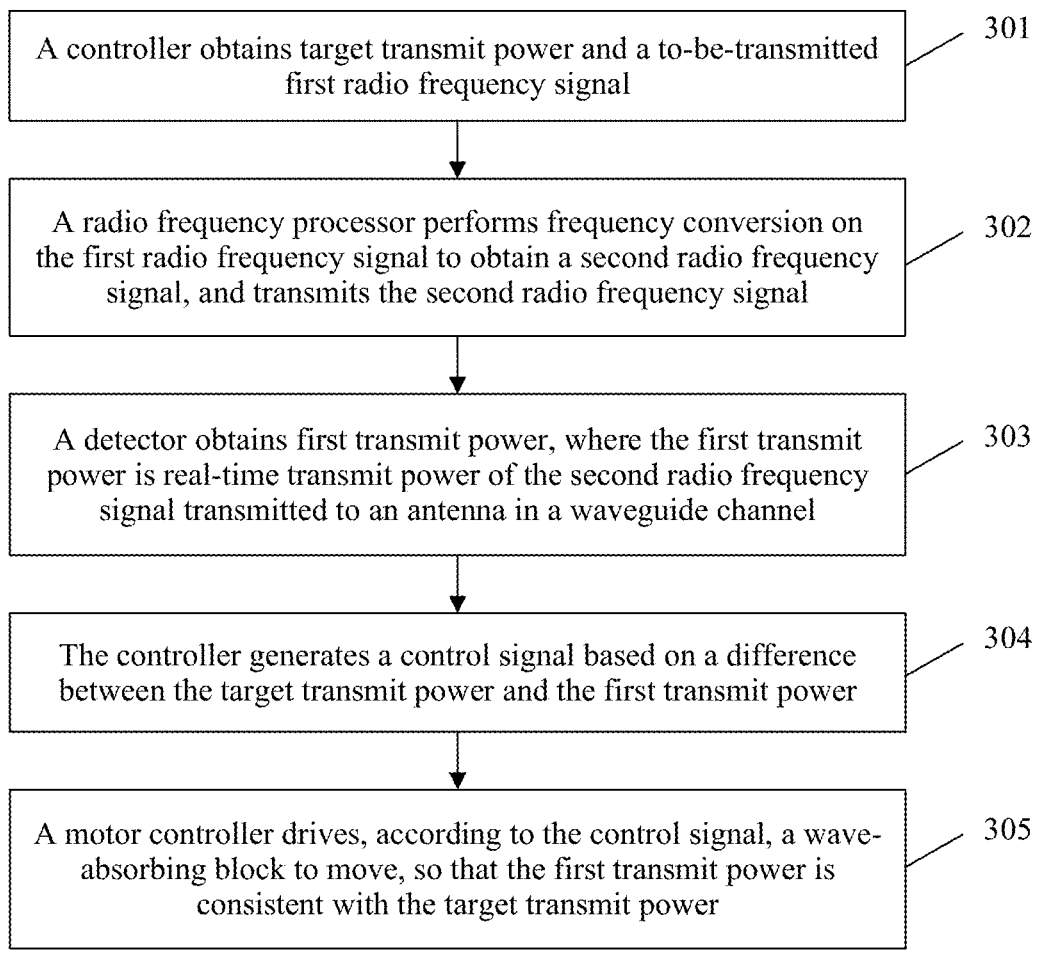
FIG. 3 is a schematic flowchart of a transmit power control method for an ODU according to an embodiment of this application.

The following describes in detail technical solutions in the embodiments of this application with reference to the accompanying drawings.

FIG. 1-*a* is a schematic diagram of an application scenario including an ODU according to an embodiment of this application. The application scenario shown in FIG. 1-*a* includes a user 101, a microwave indoor unit (Indoor Unit, IDU) 102, and an ODU 103. In a specific implementation, the user 101 operates the IDU 102 to input preset target transmit power into the IDU 102. The ODU 103 obtains the target transmit power and a to-be-transmitted first radio frequency signal from the IDU 102. The first radio frequency signal is an intermediate frequency signal. A radio frequency processor in the ODU performs frequency conversion on the first radio frequency signal to obtain a high-frequency second radio frequency signal. The second radio frequency signal is transmitted to an antenna through a waveguide channel in the ODU. A detector in the ODU detects real-time transmit power of the second radio frequency signal, transmitted to the antenna, in the waveguide channel. A controller in the ODU generates a control signal based on a difference between the target transmit power and the real-time transmit power. A motor controller in the ODU drives, according to the control signal, a wave-absorbing block to move in the waveguide channel, so that the real-time transmit power is consistent with the target transmit power. In such a closed-loop control manner, the real-time transmit power can be controlled to be consistent with the target transmit power, and moving a position of the wave-absorbing block helps the ODU transmit a radio frequency signal at relatively low transmit power.

FIG. 1-*b* is a schematic structural diagram of an ODU according to an embodiment of this application. As shown in FIG. 1-*b*, an ODU 100 may include a controller 104, a radio frequency processor 105, a waveguide channel 106, an antenna 112, a wave-absorbing block 109, a detector 111, and a motor controller 110.

The controller 104 is configured to: obtain target transmit power, first transmit power, and a to-be-transmitted first radio frequency signal, and generate a control signal based on a difference between the target transmit power and the first transmit power, where the first transmit power is real-time transmit power obtained by the detector 111 by detecting the second radio frequency signal transmitted to the antenna 112 in the waveguide channel 106.

The control signal may indicate a distance by which the motor controller 110 drives the wave-absorbing block 109 to move. For example, the control signal may instruct the motor controller 110 to drive the wave-absorbing block 109 to move down in the waveguide channel 106 by 2 millimeters. It may be understood that, the control signal may be determined based on a table or a formula stored in the controller. For example, a correspondence between the distance by which the motor controller 110 drives the wave-absorbing block 109 to move and the difference between the target transmit power and the first transmit power may be recorded in the table. For example, if the target transmit power is 3 dB lower than the first transmit power, the motor controller is instructed to drive the wave-absorbing block to move down by 1 mm.

The radio frequency processor 105 is configured to: perform frequency conversion on the first radio frequency signal to obtain the second radio frequency signal 113, and transmit the second radio frequency signal 113. The second radio frequency signal 113 is transmitted to the antenna 112 through the waveguide channel 106. An opening 107 is disposed on the waveguide channel 106.

The wave-absorbing block 109 has one end located in the waveguide channel 106 and the other end connected to the motor controller 110 through the opening 107, and is configured to absorb the second radio frequency signal 113 transmitted to a surface of the wave-absorbing block 109. This can reduce transmit power of a radio frequency signal transmitted to the antenna.

The motor controller 110 is configured to drive, according to the control signal, the wave-absorbing block 109 to move, so that the first transmit power is consistent with the target transmit power. For example, the motor controller 110 may drive the wave-absorbing block 109 to move in a straight line, rotate, or move in a straight line and rotate at the same time, provided that a position of the wave-absorbing block 109 is changed so that the first transmit power used as the real-time transmit power is consistent with the target transmit power.

It should be noted that FIG. 2-*a* is a schematic structural diagram of an ODU. The ODU includes a housing 201, a printed circuit board 202 disposed inside the housing 201 and provided with a controller and a radio frequency processor, a shielding case 203 disposed on the circuit board 202, a duplexer 204 connected to the shielding case 203, and an antenna 205 connected to the duplexer 204.

A waveguide channel may include a waveguide channel for transmitting a second radio frequency signal in the shielding case 203, and a waveguide channel for transmitting the second radio frequency signal in the duplexer 203.

The duplexer includes an output filter. The waveguide channel in the duplexer is formed sequentially by cavities of the following parts: an input waveguide port for transmitting a radio frequency signal, an input waveguide channel of the output filter, a cavity of the output filter, and an output waveguide channel and an output waveguide port of the output filter. The radio frequency signal is transmitted through the output waveguide port and the antenna. An opening on an output waveguide may be disposed in any location on the waveguide channel. For example, the opening may be disposed on the input waveguide channel of the output filter.

According to this embodiment of this application, the controller can generate the control signal based on a difference between real-time transmit power and target transmit power, and a motor controller can drive, according to the control signal, a wave-absorbing block to move in the waveguide channel. Because the wave-absorbing block can absorb an electromagnetic wave transmitted to a surface of the wave-absorbing block, driving the wave-absorbing block to move in the waveguide channel by the motor controller allows the real-time transmit power to be consistent with the target transmit power. In other words, the ODU provided in this embodiment of this application can perform closed-loop control on transmit power. In this way, the transmit power can be accurately adjusted. In addition, the wave-absorbing block is passive, and a wave-absorbing feature of the wave-absorbing block is less affected by temperature. Therefore, in this embodiment of this application, the ODU can transmit a radio frequency signal at relatively low transmit power.

Optionally, in some possible implementations of this application, as shown in FIG. 1-b, a convex cavity 108 may be disposed in the waveguide channel 106, and the opening 107 is disposed on the cavity 108. In this way, the wave-absorbing block 109 may have one part passing through the opening 107, one part located in the waveguide channel 106, and one part connected to the motor controller 110. The convex cavity 108 is disposed in the waveguide channel, so that the motor controller 110 can drive the wave-absorbing block 109 to move toward the cavity 108. For example, in FIG. 1-b, the motor controller may drive the wave-absorbing block 109 to move up, thereby reducing impact of the wave-absorbing block 109 on the transmit power.

Referring to FIG. 2-b, with reference to FIG. 1-b, in some possible implementations of this application, the wave-absorbing block 109 may be a "T"-shaped structure, including a baseplate 206 and a connecting rod 207 connected to the baseplate 206. The baseplate 206 is located in the waveguide channel 106. The connecting rod 207 protrudes from the waveguide channel through the opening 107 and is connected to the motor controller 110.

Optionally, in some possible implementations of this application, as shown in FIG. 1-b, a height h1 of the baseplate of the wave-absorbing block 109 is less than or equal to a height h2 of the cavity 108. In this way, when the transmit power does not need to be reduced by using the wave-absorbing block, the motor controller 110 may drive the wave-absorbing block 109 to be located completely inside the cavity 108. This can reduce impact of the wave-absorbing block 109 on the transmit power, thereby minimizing impact of the wave-absorbing block on the radio frequency signal.

Optionally, in some possible implementations of this application, as shown in FIG. 2-c, a chamfer 208 may be disposed at an intersection between the baseplate 206 of the wave-absorbing block and the connecting rod 207 of the wave-absorbing block. Optionally, in some possible implementations of this application, as shown in FIG. 2-d, a cross-section of the baseplate 206 in a transmission direction of the second radio frequency signal is a trapezoid. Optionally, in some possible implementations of this application, as shown in FIG. 2-d, a base angle θ of the trapezoidal baseplate 206 close to the radio frequency transmitter ranges from 30° to 60°. In a simulation experiment, when it is detected that the cross-section of the baseplate of the wave-absorbing block in the transmission direction of the second radio frequency signal is set to a trapezoid, or a chamfer is disposed between the baseplate and the connecting rod, it helps the motor controller linearly control the wave-absorbing block to move. For example, in some possible implementations, when the motor controller drives the wave-absorbing block to move up and down in the waveguide channel, 3 dB/mm can be achieved. To be specific, when the motor controller drives the wave-absorbing block to move down by 1 mm, the real-time transmit power is reduced by 3 dB.

FIG. 3 shows a transmit power control method for an ODU according to an embodiment of this application. The ODU includes a controller, a radio frequency processor, a waveguide channel, an antenna, a wave-absorbing block, a detector, and a motor controller. The method includes the following steps.

301. The controller obtains target transmit power and a to-be-transmitted first radio frequency signal.

For an implementation of step 301, refer to a corresponding description of the controller 104 in the apparatus embodiment of this application. Details are not described herein again.

302. The radio frequency processor performs frequency conversion on the first radio frequency signal to obtain a second radio frequency signal, and transmits the second radio frequency signal, where the second radio frequency signal is transmitted to the antenna through the waveguide channel, and an opening is disposed on the waveguide channel.

For an implementation of step 302, refer to a description of the radio frequency processor 105 in the apparatus embodiment of this application. Details are not described herein again.

303. The detector obtains first transmit power, where the first transmit power is real-time transmit power of the second radio frequency signal, transmitted to the antenna, in the waveguide channel.

For an implementation of step 303, refer to a description of the detector 111 in the apparatus embodiment of this application. Details are not described herein again.

304. The controller generates a control signal based on a difference between the target transmit power and the first transmit power.

For an implementation of step 304, refer to a description of the controller 104 in the apparatus embodiment of this application. Details are not described herein again.

305. The motor controller drives, according to the control signal, the wave-absorbing block to move, so that the first transmit power is consistent with the target transmit power, where the wave-absorbing block has one end located in the waveguide channel and the other end connected to the motor controller through the opening, and is configured to absorb the second radio frequency signal transmitted to a surface of the wave-absorbing block.

For an implementation of step 305, refer to a description of the motor controller 110 in the apparatus embodiment of this application. Details are not described herein again.

According to the embodiment of this application, the controller can generate the control signal based on the difference between the real-time transmit power and the target transmit power, and the motor controller can drive, according to the control signal, the wave-absorbing block to move in the waveguide channel. Because the wave-absorbing block can absorb an electromagnetic wave transmitted to the surface of the wave-absorbing block, driving the wave-absorbing block to move in the waveguide channel by the motor controller allows the real-time transmit power to be consistent with the target transmit power. In other words, the ODU provided in this embodiment of this application can perform closed-loop control on transmit power. In this way, the transmit power can be accurately adjusted. In addition, the wave-absorbing block is passive, and a wave-absorbing feature of the wave-absorbing block is less affected by temperature. Therefore, in this embodiment of this application, the ODU can transmit a radio frequency signal at relatively low transmit power.

In the foregoing embodiments, the descriptions of the embodiments have respective focuses. For a part that is not described in detail in an embodiment, refer to a related description in another embodiment.

In the several embodiments provided in this application, it should be understood that the disclosed apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electrical or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

When the foregoing integrated unit is implemented in the form of a software functional unit and sold or used as an independent product, the integrated unit may be stored in a computer readable storage medium. Based on such an understanding, the technical solutions of this application essentially, or the part contributing to the prior art, or all or some of the technical solutions may be implemented in the form of a software product. The computer software product is stored in a storage medium and includes several instructions for instructing a computer device (which may be a personal computer, a server, or a network device, and specifically, may be a processor in the computer device) to perform all or some of the steps of the methods in the embodiments of this application. The foregoing storage medium may include any medium that can store program code, such as a USB flash drive, a removable hard disk, a magnetic disk, an optical disc, a read-only memory (ROM, Read-Only Memory), or a random access memory (RAM, Random Access Memory).

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. An ODU, comprising: a controller, a radio frequency processor, a waveguide channel, an antenna, a wave-absorbing block, a detector, and a motor controller, wherein
the controller is configured to: obtain target transmit power, first transmit power, and a to-be-transmitted first radio frequency signal, and generate a control signal based on a difference between the target transmit power and the first transmit power, wherein the first transmit power is real-time transmit power obtained by the detector by detecting a second radio frequency signal, transmitted to the antenna, in the waveguide channel;
the radio frequency processor is configured to: perform frequency conversion on the first radio frequency signal to obtain the second radio frequency signal, and transmit the second radio frequency signal, wherein the second radio frequency signal is transmitted to the antenna through the waveguide channel, and an opening is disposed on the waveguide channel;
the wave-absorbing block has one end located in the waveguide channel and the other end connected to the motor controller through the opening, and is configured to absorb the second radio frequency signal transmitted to a surface of the wave-absorbing block; and
the motor controller is configured to drive, according to the control signal, the wave-absorbing block to move, so that the first transmit power is consistent with the target transmit power.

2. The ODU according to claim 1, wherein
a convex cavity is disposed in the waveguide channel, and the opening is disposed on the cavity.

3. The ODU according to claim 2, wherein
the wave-absorbing block is in a "T"-shaped structure and comprises a baseplate and a connecting rod connected to the baseplate, the baseplate is located in the waveguide channel, and the connecting rod protrudes from the waveguide channel through the opening and is connected to the motor controller; and
a height of the baseplate is less than or equal to a height of the cavity.

4. The ODU according to claim 3, wherein
a cross-section of the baseplate in a transmission direction of the second radio frequency signal is a trapezoid.

5. The ODU according to claim 1, wherein
the ODU further comprises a shielding case and a duplexer that are located between the radio frequency processor and the antenna; and
the waveguide channel comprises a waveguide channel for transmitting the second radio frequency signal in the shielding case, and a waveguide channel for transmitting the second radio frequency signal in the duplexer.

6. A transmit power control method for an ODU, wherein the ODU comprises a controller, a radio frequency processor, a waveguide channel, an antenna, a wave-absorbing block, a detector, and a motor controller, and the method comprises:
obtaining, by the controller, target transmit power and a to-be-transmitted first radio frequency signal;
performing, by the radio frequency processor, frequency conversion on the first radio frequency signal to obtain a second radio frequency signal, and transmitting the second radio frequency signal, wherein the second radio frequency signal is transmitted to the antenna through the waveguide channel, and an opening is disposed on the waveguide channel;
obtaining, by the detector, first transmit power, wherein the first transmit power is real-time transmit power of the second radio frequency signal, transmitted to the antenna, in the waveguide channel;
generating, by the controller, a control signal based on a difference between the target transmit power and the first transmit power; and
driving, by the motor controller according to the control signal, the wave-absorbing block to move, so that the first transmit power is consistent with the target transmit power, wherein the wave-absorbing block has one end located in the waveguide channel and the other end connected to the motor controller through the opening, and is configured to absorb the second radio frequency signal transmitted to a surface of the wave-absorbing block.

7. The method according to claim 6, wherein a convex cavity is disposed in the waveguide channel, and the opening is disposed on the cavity.

8. The method according to claim 7, wherein the wave-absorbing block is in a "T"-shaped structure and comprises a baseplate and a connecting rod connected to the baseplate, the baseplate is located in the waveguide channel, and the connecting rod protrudes from the waveguide channel through the opening and is connected to the motor controller; and a height of the baseplate is less than or equal to a height of the cavity.

9. The method according to claim 8, wherein a cross-section of the baseplate in a transmission direction of the second radio frequency signal is a trapezoid.

10. The method according to claim 6, wherein the ODU further comprises a shielding case and a duplexer that are located between the radio frequency processor and the antenna; and the waveguide channel comprises a waveguide channel for transmitting the second radio frequency signal in the shielding case, and a waveguide channel for transmitting the second radio frequency signal in the duplexer.

* * * * *